(12) United States Patent
Pellizzer et al.

(10) Patent No.: US 11,476,304 B2
(45) Date of Patent: Oct. 18, 2022

(54) PHASE CHANGE MEMORY DEVICE WITH VOLTAGE CONTROL ELEMENTS

(71) Applicant: MICRON TECHNOLOGY, INC., Boise, ID (US)

(72) Inventors: Fabio Pellizzer, Boise, ID (US); Antonino Rigano, Pioltello (IT)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 15/375,976

(22) Filed: Dec. 12, 2016

(65) Prior Publication Data

US 2017/0092696 A1 Mar. 30, 2017

Related U.S. Application Data

(62) Division of application No. 12/979,461, filed on Dec. 28, 2010, now Pat. No. 9,525,007.

(51) Int. Cl.
| | |
|---|---|
| *H01L 45/00* | (2006.01) |
| *H01L 27/24* | (2006.01) |
| *H01L 27/02* | (2006.01) |
| *G11C 13/00* | (2006.01) |

(52) U.S. Cl.
CPC ...... *H01L 27/2463* (2013.01); *G11C 13/0004* (2013.01); *H01L 27/0207* (2013.01); *H01L 45/06* (2013.01); *H01L 45/1233* (2013.01); *H01L 45/16* (2013.01); *H01L 45/1691* (2013.01)

(58) Field of Classification Search
CPC .................................................. H01L 27/2463
USPC ........................................................... 438/129
See application file for complete search history.

(56) References Cited

U.S. PATENT DOCUMENTS

| | | |
|---|---|---|
| 6,791,107 B2 | 9/2004 | Gill et al. |
| 7,257,039 B2 | 8/2007 | Bedeschi et al. |
| 7,446,011 B2 | 11/2008 | Pellizzer et al. |
| 7,570,524 B2 | 8/2009 | Bedeschi et al. |
| 7,929,339 B2 | 4/2011 | Kang et al. |
| 7,986,549 B1 | 7/2011 | Tang et al. |
| 8,045,368 B2 | 10/2011 | Em |
| 8,243,497 B1 | 8/2012 | Pellizzer et al. |
| 8,351,246 B2 | 1/2013 | Porter |
| 2005/0117388 A1 | 6/2005 | Cho et al. |
| 2005/0265072 A1 | 12/2005 | Hart et al. |
| 2008/0144347 A1 | 6/2008 | Takemura et al. |
| 2008/0232160 A1 | 9/2008 | Gopalakrishnan |
| 2008/0303016 A1 | 12/2008 | Cho et al. |
| 2009/0152645 A1* | 6/2009 | Tran ............... H01L 27/1157 257/401 |

(Continued)

OTHER PUBLICATIONS

Pellizzer et al., "Phase-Change Memories for Non-Scale Technology and Design", Micron, Process R&D, (no publication date available); pp. all.

(Continued)

*Primary Examiner* — Hsin Yi Hsieh
(74) *Attorney, Agent, or Firm* — Dorsey & Whitney LLP

(57) ABSTRACT

A phase change memory device with reduced programming disturbance and its operation are described. The phase change memory includes an array with word lines and bit lines and voltage controlling elements coupled to bit lines adjacent to an addressed bit line to maintain the voltage of the adjacent bit lines within an allowed range.

20 Claims, 9 Drawing Sheets

(56) References Cited

U.S. PATENT DOCUMENTS

2012/0009758 A1    1/2012    Chang
2012/0161096 A1    6/2012    Pellizzer
2014/0247654 A1    9/2014    Rigano et al.

OTHER PUBLICATIONS

Servalli, "A 45nm Generation Phase Change Memory Technology", Numonyx—R&D Technology Development, (no publication date available); pp. all.

U.S. Appl. No. 15/858,728, entitled 'Clamp Elements for Phase Change Memory Arrays', filed Dec. 29, 2017.

\* cited by examiner

PHASE CHANGE MEMORY DEVICE WITH VOLTAGE CONTROL ELEMENTS

CROSS REFERENCE TO RELATED APPLICATION(S)

This application is a divisional of pending U.S. patent application Ser. No. 12/979,461 filed Dec. 28, 2010, which issued as U.S. Pat. No. 9,525,007 on Dec. 20, 2016. The aforementioned application is incorporated herein by reference, in its entirety, for any purpose.

BACKGROUND

Embodiments of the present invention relate to memories and especially non-volatile memory devices. Even more specifically, embodiments of the invention relate to phase change memories.

Chalcogenide containing semiconductors include a chalcogenide layer which is an alloy of various chalcogens. For example, the well known GST alloy is a composite of germanium, antimony, and tellurium. Many other alloys are known. In addition to alloys used in phase change memories, chalcogenide alloys are also used for ovonic threshold switches, the difference being that the chalcogenide layer in the ovonic threshold switch normally does not change phase.

BRIEF DESCRIPTION OF THE DRAWINGS

The features and advantages of the present invention will be made apparent by the following detailed description of some embodiments thereof, illustrated merely by way of non-limiting examples in the annexed drawings, wherein.

DETAILED DESCRIPTION

Figure 1:
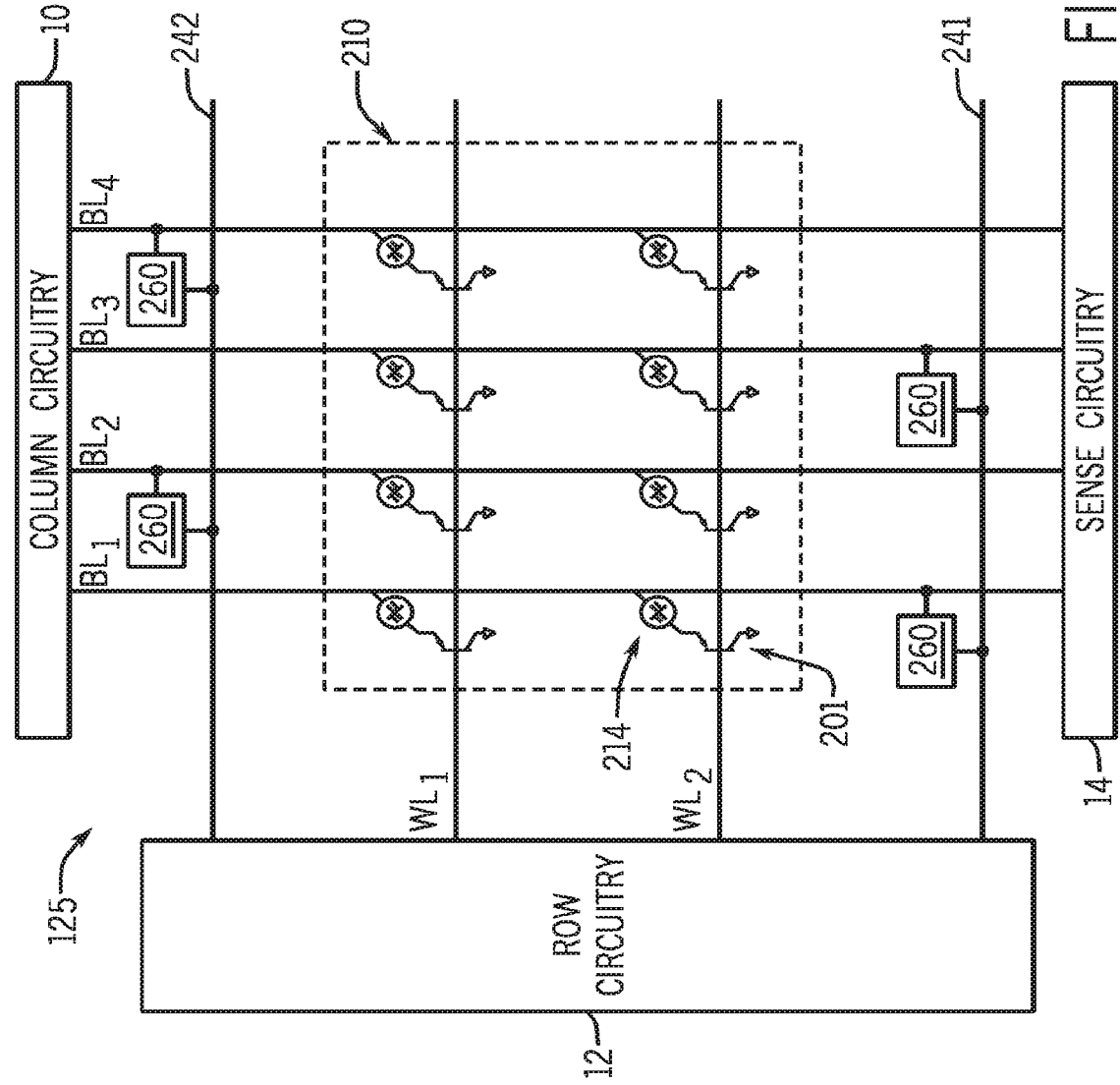
FIG. 1 illustrates a schematic representation of a portion of a memory array according to an embodiment of the invention.

A phase change memory (PCM) 125, shown in FIG. 1, includes a PCM array 210 for storing data in PCM cells. The PCM cells include alloys of elements of group VI of the periodic table, elements such as Te or Se, that are referred to as chalcogenides or chalcogenic materials. Taking the phase change material as $Ge_2Sb_2Te_5$ (GST) for example, two phases or more are exhibited having distinct electrical characteristics useful for memory storage. The chalcogenide compound remains stable even after the power is removed from the non-volatile memory and therefore allows data retention.

Array 210 includes memory cells each having at least a selector device 201 and a storage element 214. Each cell is coupled to a column or bit line ($BL_n$) and to a row or word line ($WL_n$) and is located at their crossing and is individually addressable by appropriate selection of corresponding bit line and word line in the column circuitry 10 and in the row circuitry 12, respectively. Bit lines are also coupled to sense circuitry 14 for reading the cells in the PCM array 210.

Although the array is illustrated with bipolar junction transistors (BJT) as selector devices 201, it should be noted that alternative embodiments may use CMOS selector devices or diodes to identify and selectively change the electrical properties (e.g. resistance, capacitance, etc.) in at least a local portion of the chalcogenide material through the application of energy such as, for example, heat, light, voltage potential, or electrical current. In one embodiment, multilevel storage capability in the PCM cells is obtained by electrically switching the chalcogenic material between different states intermediate between the amorphous and the crystalline states.

In one embodiment, the PCM cells are grouped in subsets, for example for four cells, in the direction of the word lines, and the base of the BJT selectors is strapped by low-resistance metallic connections, for example with copper lines through contact plugs to the N-type base region. Bit lines may also be strapped, for example with copper lines, at regular intervals, such as every 128 rows.

To alter the state of phase of the memory material, a programming voltage potential that is greater than the threshold voltage of the memory select device may be applied to the addressed memory cell. In one embodiment, the addressed word line is biased to a word line programming voltage, for example in the range 0 to 0.5V, i.e. 0.2V, and the addressed bit line is biased to a ramped programming voltage up to about 3 to 6V, i.e. 4.5V. The unaddressed word lines are biased to a program inhibition voltage that may be the bit line programming voltage, to avoid any programming of the PCM cells thereon. More than a single bit line may be simultaneously addressed.

An electrical current flows through the addressed memory cell producing heating of the memory material, for example by Joule effect on a resistive heater coupled between the BJT selector and the chalcogenide material, whose temperature is locally raised above the melting temperature, for example above 600° C. Then the chalcogenic material solidifies under controlled cooling conditions so that the desired memory state or phase of the memory material is obtained, with a correspondingly different electrical characteristic. More precisely, a rapid cooling places the phase change material in the amorphous state that is referred to as a reset state where stored data has a "0" value. Taking Ge2Sb2Te5 as an example, the time between achieving the melting temperature and quenching after the local heating to achieve the amorphous phase may be less than 50 nanoseconds. If the cooling rate is slower, crystallization takes place and where the phase change material is in the crystalline form it is referred to as a set state and stored data has a "1" value. In another embodiment, crystallization from the amorphous phase is obtained by heating the chalcogenic material at a temperature lower than the melting temperature for a sufficiently long time to allow for structure reordering of the solid phase. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. It is to be appreciated that the association of reset and set with amorphous and crystalline states, respectively, is a convention and that at least an opposite convention may be adopted. In an embodiment, a programming current is directly forced through the memory cell to generate heat resulting in the local melting of the chalcogenic compound; to program the cell, fast/slow GST solidification speed is then obtained by accurate control of duration and amplitude of the programming current pulse.

In the reduced programming disturbance phase change memory 125 (see FIG. 1), voltage controlling elements 260 are coupled to the bit lines. During programming, these elements on unaddressed bit lines help to prevent undesired changes that may alter the state of unaddressed memory cells. In one embodiment, the elements 260 are grouped in at least two subsets, one coupled to odd bit lines and one to even bit lines. Two voltage controlling word lines 241 and 242 are respectively coupled to voltage controlling elements 260 for odd bit lines and for even bit lines. In the embodiment depicted in FIG. 1, the voltage controlling elements 260 and the voltage control word lines 241 and 242 are located outside of the PCM array 210, for example the two word lines are at opposite sides of the PCM array 210, however, they may also be on the same side. In another embodiment, the PCM array 210 is physically (although not necessarily also logically) divided in two or more regions and one or more voltage control word lines with the associated voltage controlling elements are spatially interposed between said physical regions. With such a spatial arrangement, the effectiveness of the voltage control effect may be even greater since the bit line RC, or charging/discharging time constant, is diminished. In some embodiments, the voltage controlling elements 260 are decodable with a finer granularity, for example, they are individually addressable.

Elements 260 control the unaddressed bit line voltage and reduce spurious and undesired effects on PCM cells sharing the addressed word line and on a bit line adjacent to the addressed cell during programming. Without elements 260, the voltage of the otherwise floating bit lines adjacent to the addressed cell would rise during the program pulse because the unaddressed bit lines are capacitively coupled to the addressed bit line. Such a voltage increase on unaddressed bit lines may result in the undesired programming of the unaddressed PCM cells. The unaddressed bit line's voltage is controlled so that it does not exceed a tolerable value, thereby reducing possible disturbances on cells adjacent to the addressed cell. At all times during the programming pulse, the current through the unaddressed cell on $BL_2$, adjacent to the addressed one on $BL_3$, is sufficiently low so that it does not produce any relevant disturbance in some embodiments. Moreover, since the base of the BJT selectors of the adjacent PCM cells on the same word line is shared in one embodiment, parasitic bipolar transistors are inevitably formed and the emitter of the cell adjacent to the addressed one behaves as the collector of such a parasitic BST, producing an undesired current injection into the unaddressed memory cell. Such an undesired current injection is reduced through the use of elements 260 and correspondingly the unaddressed memory cells may be less prone to state change in connection with such an electric disturbance. Typically, the voltage of unaddressed bit lines at both sides of an addressed bit line is controlled (for example, if $BL_3$ is the addressed bit line, elements 260 coupled to both $BL_2$ and $BL_4$ control the voltage on these bit lines). However, only the voltage of one unaddressed bit line that is adjacent to an addressed one is controlled when the addressed bit line is close to the array border or to a discontinuity in the periodicity of the bit lines (for example, if $BL_4$ is the addressed bit line, $BL_3$ is the only unaddressed adjacent bit line and only element 260 coupled to it controls the voltage on $BL_3$).

Figure 2:
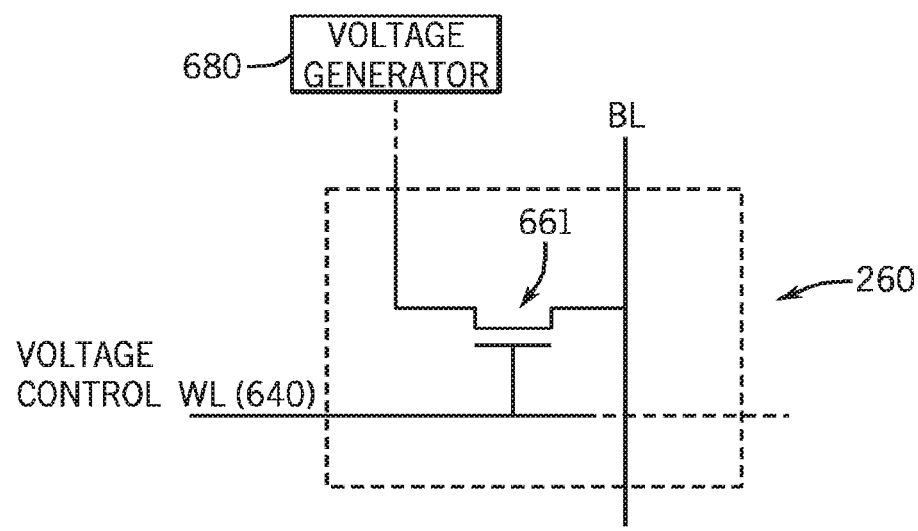
FIG. 2 illustrates a schematic representation of a further embodiment of a voltage controlling element.

In another embodiment, illustrated in FIG. 2, the voltage controlling elements 260 comprise a voltage controlling transistor 661 coupled between the bit line and a voltage generator 680. The gate of voltage controlling transistor 661 is coupled to the voltage control line 640, so that the voltage supplied by the voltage generator 680 is applied to the bit line when the voltage controlling transistor 661 is biased to its ON state. The voltage control line 640 may correspond to the voltage control word line. During programming, in one embodiment, a pulse is applied to the addressed bit line and the unaddressed bit line is biased to a voltage of about 0.3 to 1.3V, for example 1.0V, supplied by the voltage generator 680. The voltage control line 640 is biased to a pass voltage, for example 3.0V, so that the transistor 661 effectively transfers the voltage generator voltage to the unaddressed bit line.

In one embodiment, the voltage controlling transistor is a triple-well transistor (not shown in FIG. 2), i.e. its body voltage can be regulated independently from the substrate of the chip. This is achieved by having the transistor's body in a P-well completely embedded into an N-well into the P-type substrate of the chip. With this configuration, by appropriate N-well polarization, a reverse biased diode is always present between the transistors body and the chip's substrate so that the voltage controlling transistor 661 may regulate the unaddressed bit line voltage not only during the positive ramp of the programming pulse, but also during its negative ramp at the end of the pulse. This also reduces disturbances on unaddressed cells during the ramp-down of the programming voltage on the addressed bit line, when adjacent unaddressed bit lines tend to lower their voltage through capacitive coupling and an undesired negative current may be injected into the unaddressed cells accordingly.

Figure 3:
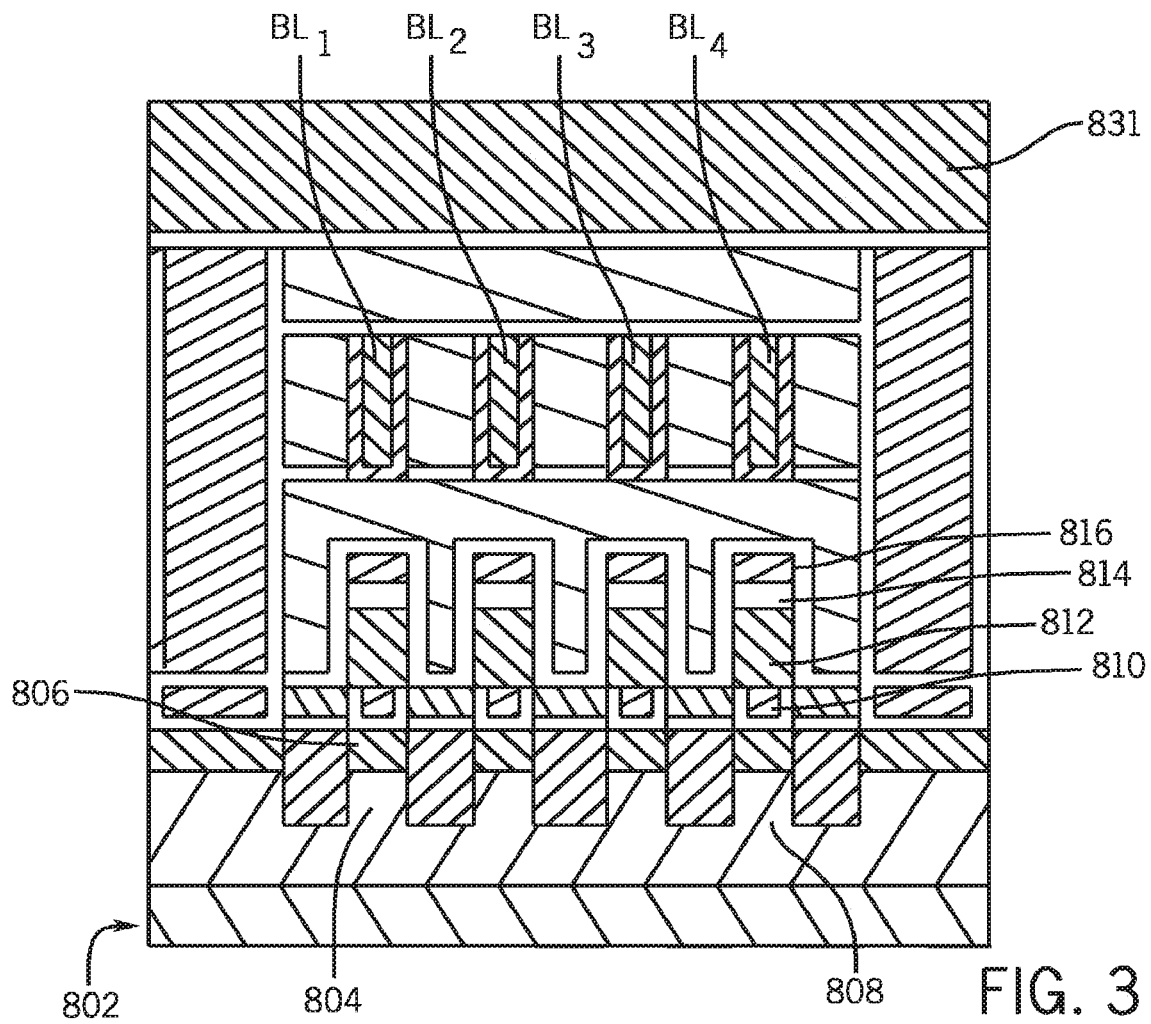
FIG. 3 illustrates an embodiment of a cross-section along a word line in a PCM array.
Figure 4:
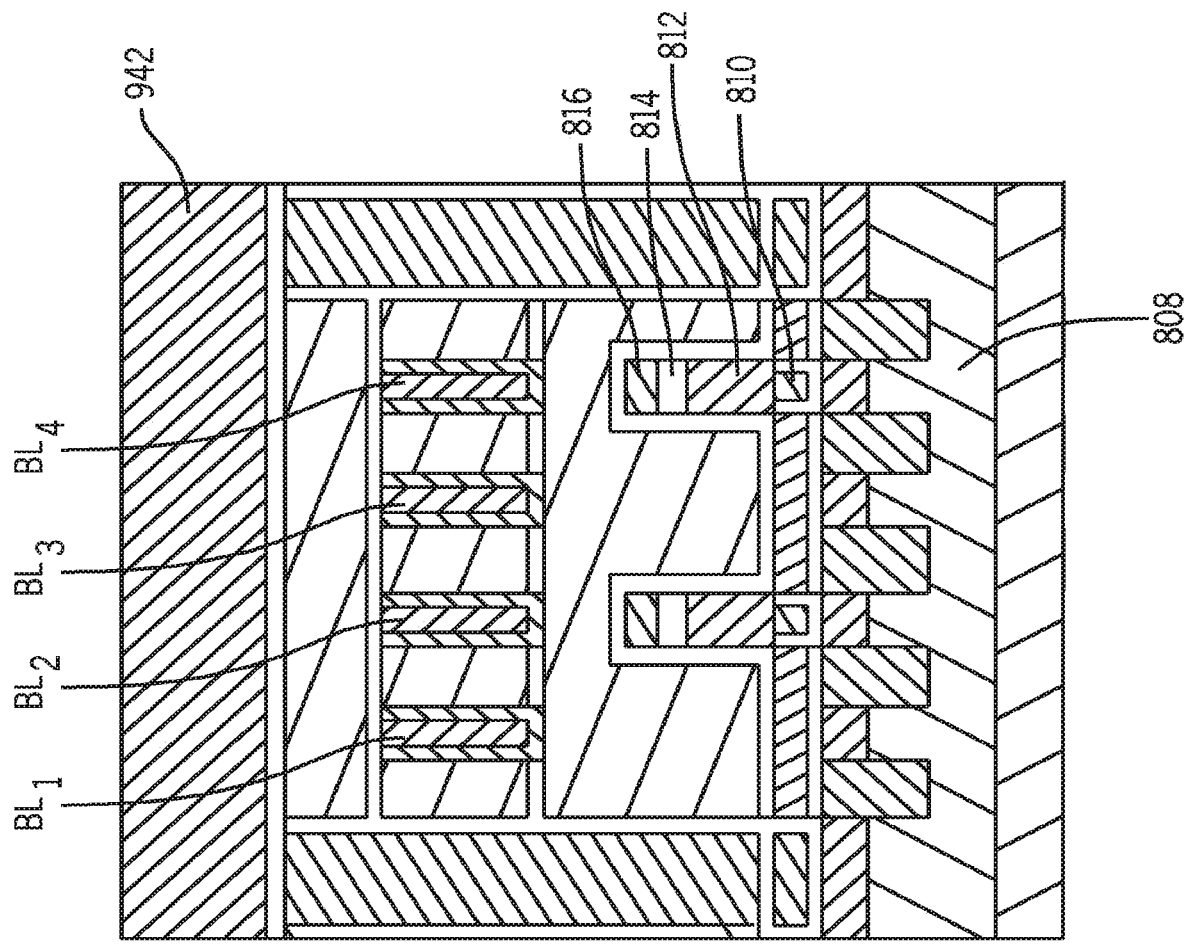
FIG. 4 illustrates a cross-section along a voltage control word line according to an embodiment of the invention.
Figure 5:
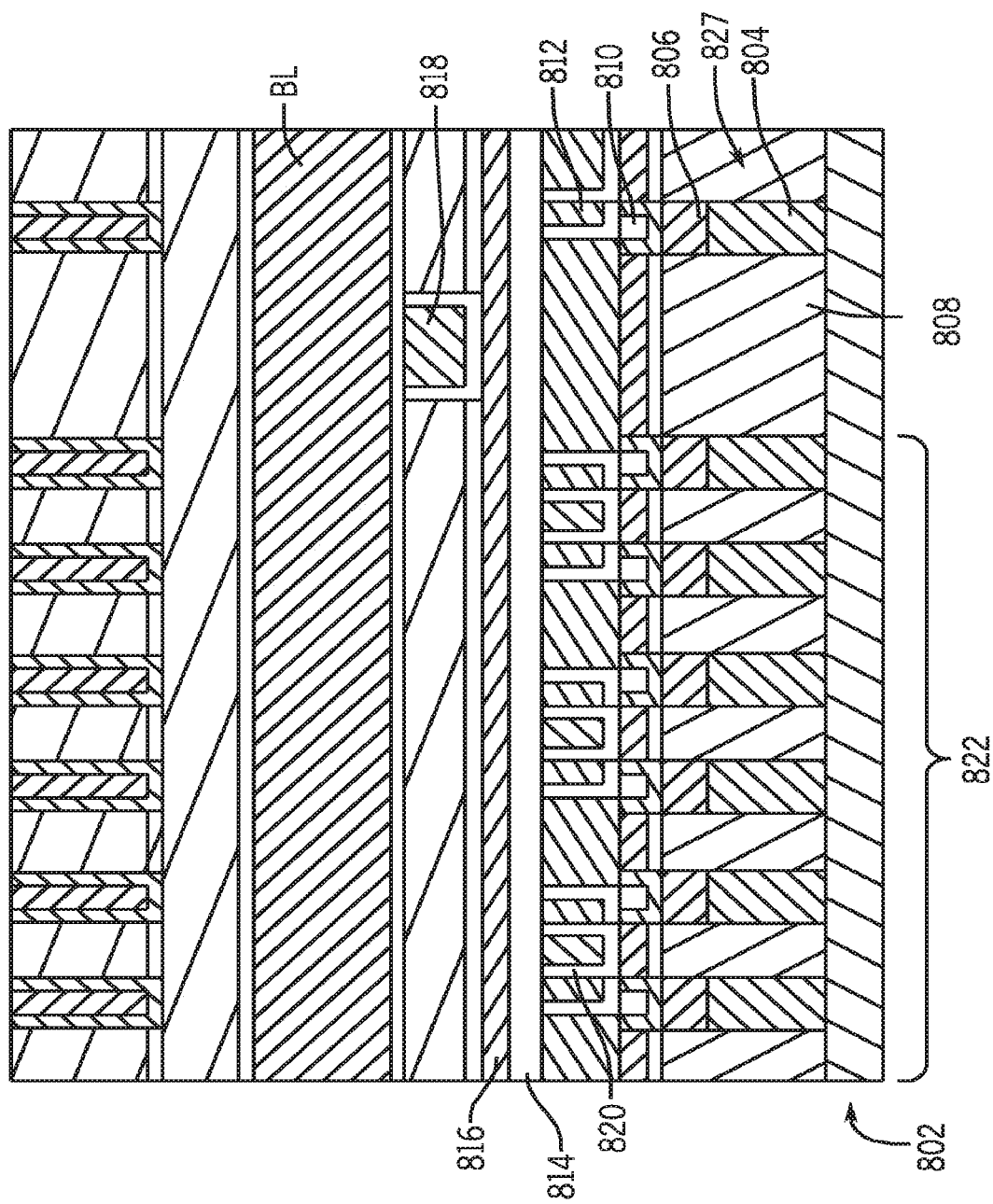
FIG. 5 illustrates a cross-section along a bit line according to an embodiment of the invention.

FIG. 3 illustrates a cross-section along a word line 831 in the PCM array and FIG. 4 illustrates a cross-section along a voltage control word line 942 (for even bit lines in FIG. 4). FIG. 5 illustrates a cross-section along a bit line BL according to one embodiment of the invention. In this particular embodiment, bit lines are grouped in subsets of four ($BL_1$-$BL_4$) to obtain a low-resistivity base 804 through frequent contacts of the word lines 831 or 942 to the N-type base 804; however, this is a mere example and another or no grouping at all may be used.

In one embodiment, illustrated in the cross-section of FIG. 3 and leftmost part of the cross-section of FIG. 5, each PCM memory cell 820 in the array 822, with corresponding vertical BJT selection transistor 827, heater 812 and GST storage material 814, is coupled to a metal bit line ($BL_1$-

BL$_4$), the bit line strap 818 visible at the right side of FIG. 5. The collector 802 of the BJT may be in a P-type well shared by all cells in the array, while the base 804 may be in an N-type well in the word line direction. Each N-well is insulated from adjacent N-wells by field oxide regions 808 and is coupled to metallic (i.e. copper) word lines on N+ doped contact regions through contact plugs 810 to N-well base, for example comprising tungsten. Each PCM cell has its own emitter 806 in a P-type diffusion in one embodiment. A plug 810, for example including tungsten, is coupled between the emitter 806 and a heater 812. In one embodiment, the heater is obtained by conformal deposition of a thin semi-metallic layer, for example of titanium nitride, on a patterned surface.

A chalcogenic material 814, for example GST, is deposited and capped with a lower resistivity material 816, such as a TiN alloy.

Figure 12:
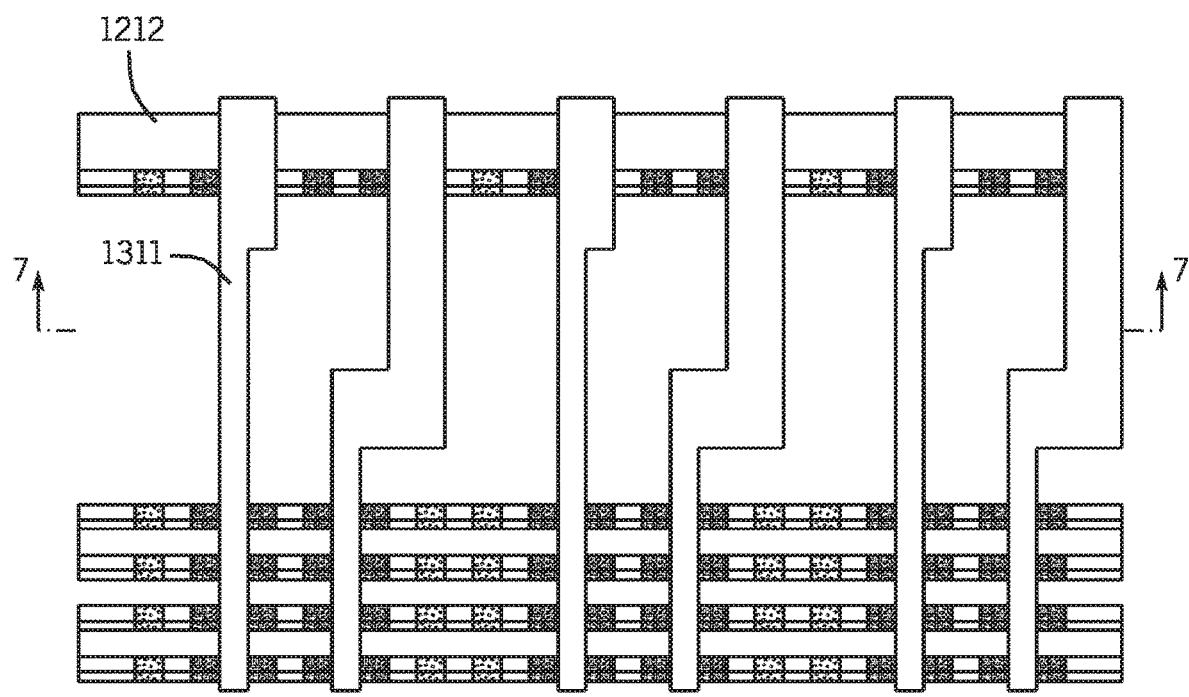
FIG. 12 is a top plan view of a pattern transfer layer according to one embodiment.

A heater mask 1212, shown in FIG. 12, creates trenches in the word line direction with a pitch twice the word line pitch in the array region. The heater material (e.g. TiN, TiAlN, TiSiN, . . . ) and a dielectric layer, for example silicon nitride, are then deposited and etched back, so that double-layer (e.g. TiN/Si$_3$N$_4$) spacers are formed on the vertical sidewall of the trench. The etch removes the heater material from the bottom of the trench therefore insulating the heater elements on opposite sidewalls of the same trench (therefore the heater pitch in the bit line direction is half that of the heater mask 1212 of FIG. 12). Alternatively, the heater may be defined by conventional photolithographic techniques.

Figure 6:
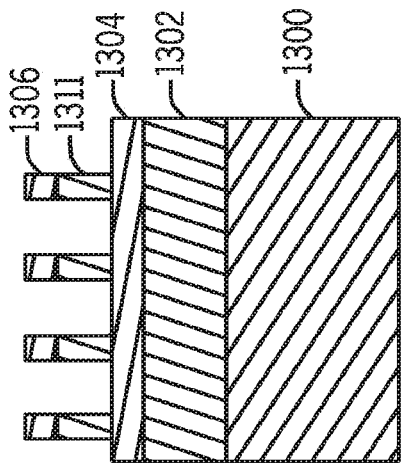
FIG. 6 is a cross-section taken generally along the line 6-6 in FIG. 13.
Figure 7:
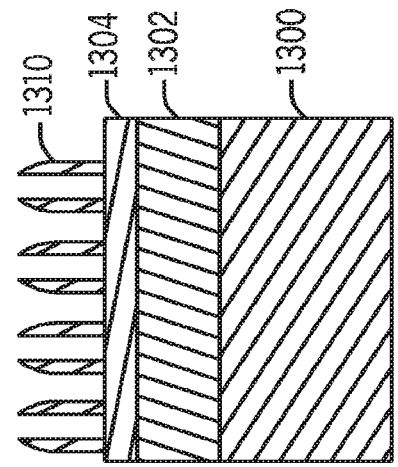
FIG. 7 is an enlarged, cross-sectional view at a subsequent stage according to one embodiment.

A technique for pitch doubling is shown in FIGS. 6-11. In FIG. 6 a mask M is exposed over a substrate 1300. The substrate 1300 is covered by a first hard mask 1302, first capping layer 1304, second hard mask 1306, and second capping layer 1311. Then a pattern is transferred to the second capping layer 1311 and second hard mask 1306, as shown in FIG. 7. The transferred pattern layer 1311, also shown in FIG. 12, has twice the desired pitch.

Figure 8:
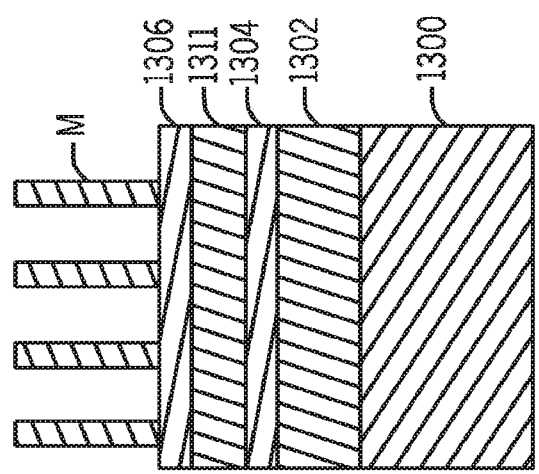
FIG. 8 is an enlarged, cross-sectional view at a subsequent stage according to one embodiment.

Then, in FIG. 8, the structure may be coated with a sidewall spacer forming material 1320, which may be any inorganic material, including a dielectric or a conductor. As one example, the spacer may be a Si$_3$N$_4$ layer. The structure, shown in FIGS. 8 and 13, is then exposed to an anisotropic spacer etch to form the spacers 1310, shown in FIGS. 9 and 13.

Figure 9:
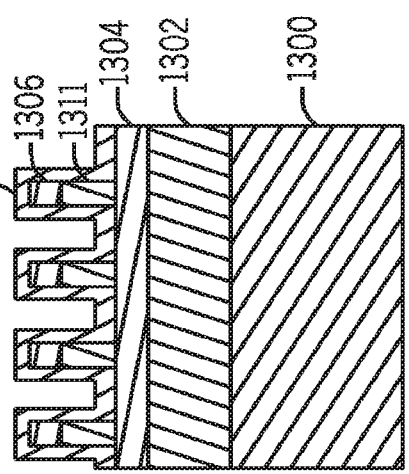
FIG. 9 is an enlarged, cross-sectional view at a subsequent stage according to one embodiment.
Figure 10:
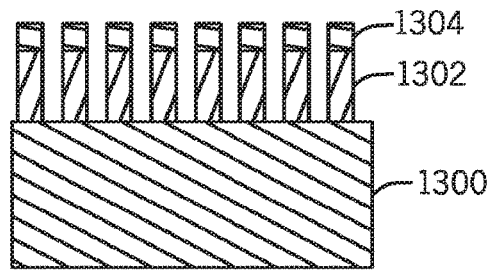
FIG. 10 is an enlarged, cross-sectional view at a subsequent stage in accordance with one embodiment.
Figure 11:
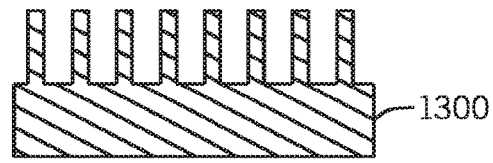
FIG. 11 is an enlarged, cross-sectional view at a subsequent stage in accordance with one embodiment.

The spacers 1310, shown in FIG. 9, have the actual desired pitch and are then used as a mask to etch the lower capping layer 1304 and hard mask 1302, as shown in FIG. 10. Then, this patterned mask is finally used to transfer the doubled pitch pattern to the underlying substrate 1300, as shown in FIG. 11.

Figure 13:
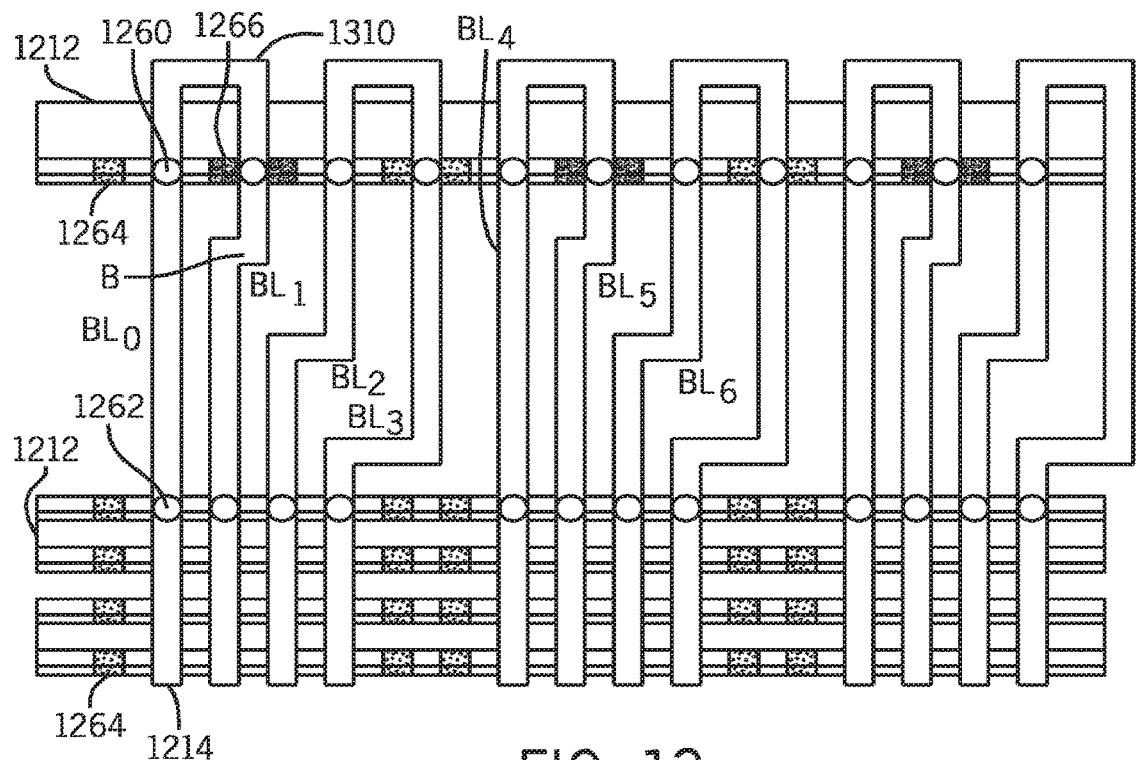
FIG. 13 is a top plan view after pattern transfer according to one embodiment.

FIG. 13 represents the real pattern corresponding to the simplified FIG. 9, the mask 1214 having a closed polygonal shape. The cells 1260 are formed at the intersections of the bit line mask 1214 and heater mask 1212. Emitter areas 1266 and base areas 1264 are formed along heater mask 1212.

Figure 13A:
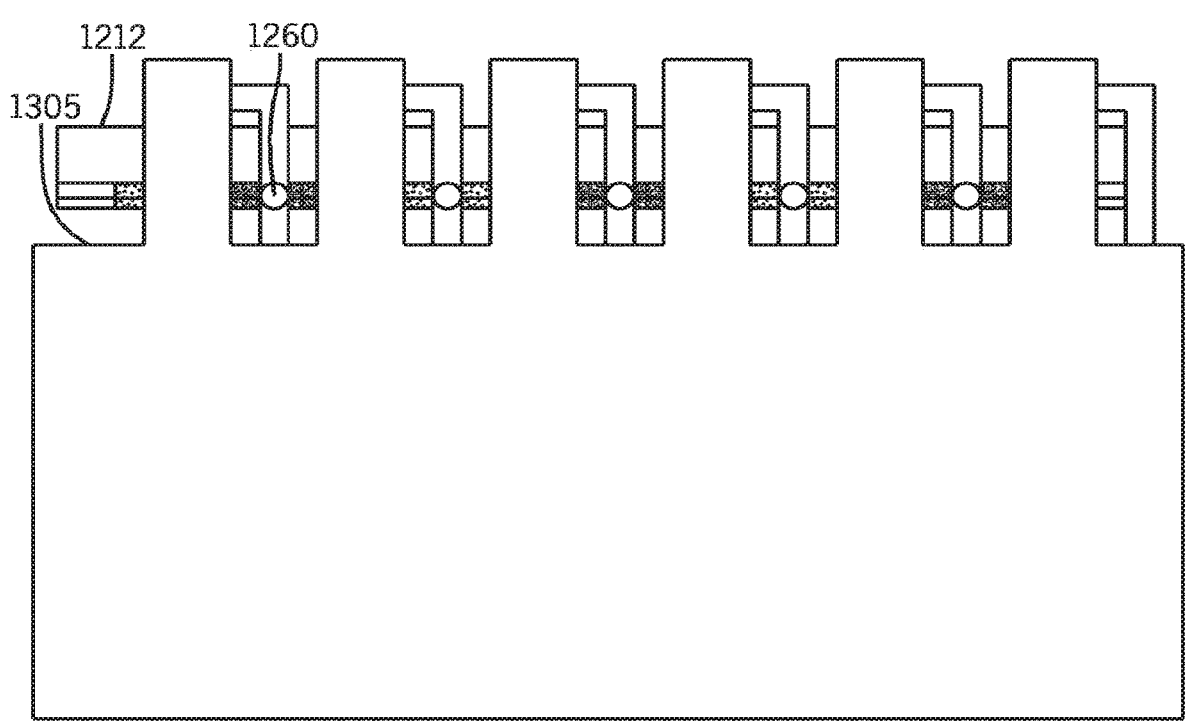
FIG. 13a is a top plan view of a cut mask according to one embodiment.

In order to remove the loops that would short, for example, BL0 and BL1, an additional cut mask 1305, shown in FIG. 13a, chops the pattern 1214 and breaks the loops. At this point, the pattern may be transferred into the first capping layer 1304 and the first hard mask 1302 and PCM memory cells are defined in the bit line direction using this final mask stack, which comprises the first hard mask and the first capping layer (see FIG. 14) and protects the TiN and GST along bit lines and etches it from the regions between adjacent bit lines.

Figure 14:
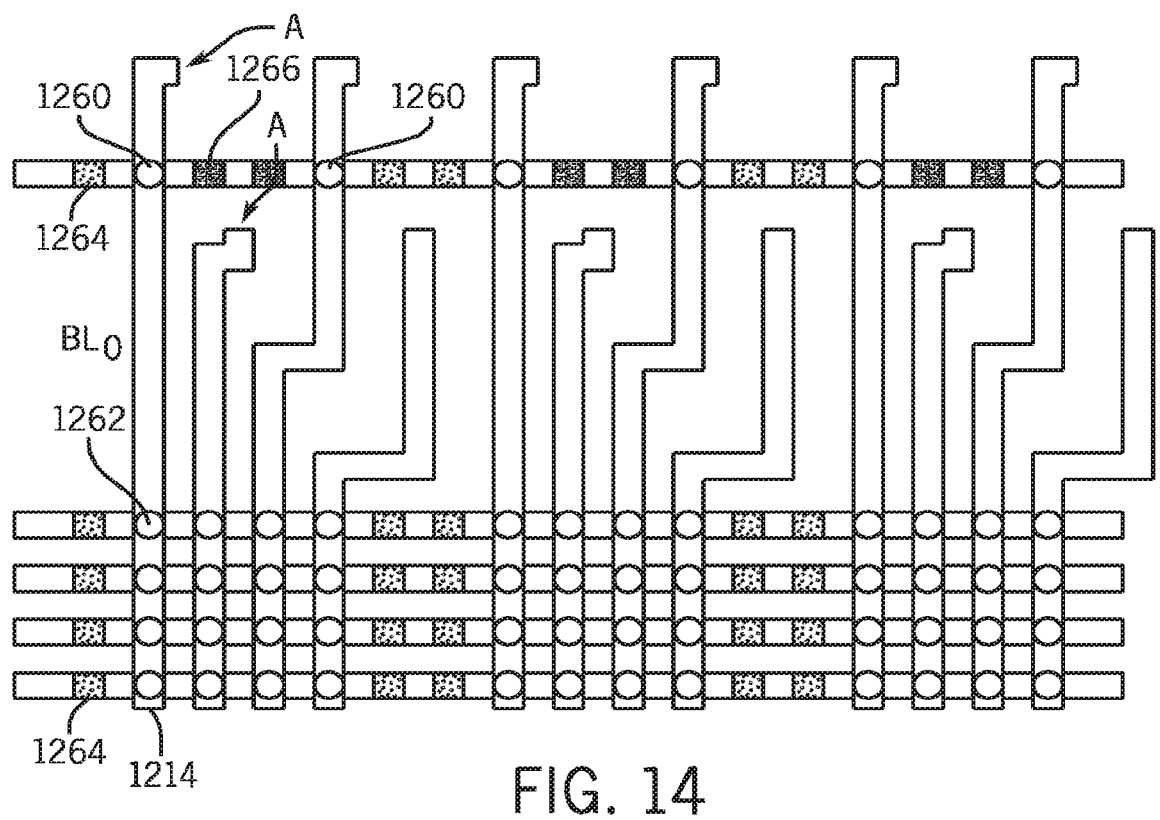
FIG. 14 illustrates the layout of two photolithographic masks used in a method to produce a PCM device according to one embodiment of the invention.

A plurality of TiN/GST bit lines is therefore formed. During this operation, the heater of each PCM cell is also defined and separated (in the word line direction) from heaters of memory cells on adjacent bit lines. The bit lines are periodically strapped with lower resistivity metal bit lines. PCM memory cells 1262 are essentially defined at the crossing of each TiN/GST bit line with each heater (in the word line direction). As shown in FIG. 14, this occurs where each sidewall of the heater mask 1212 overlaps the GST bit line mask 1214. The heater heats when current flows through it and during a program operation it reaches a high temperature (above the melting temperature of the GST), therefore producing the local melting of the chalcogenic material. PCM cells are sealed for example with a SiN layer and insulated with a dielectric such as silicon oxide layer; conventional metallization steps follow to complete the metallic interconnections (bit lines, word lines, etc.), i.e. including copper. It is noted that, although not explicitly mentioned in the description above, other layers may be present (barriers, stopping layers, or the like), especially at the interfaces, i.e. tungsten plug/silicon, heater/GST, copper lines, dielectrics, etc.

FIG. 14 shows that the GST bit line mask 1214, at the border of the array region, has an alternating pattern, in which even bit lines, corresponding to BL$_2$ and BL$_4$ in previous figures, extend away from the array more than odd bit lines, corresponding to BL$_2$ and BL$_3$. In particular, even bit lines in this GST bit line mask 1214 at least partially overlap the pattern defined with the heater mask 1212. According to the manufacturing process described above with reference to the array portion of the memory chip, also at the overlap between a sidewall defined by heater mask 1212 and the GST bit line mask 1214 a PCM (voltage control) element 1260 is formed. Such PCM voltage control elements 1260 are only present on even bit lines BL$_2$ and BL$_4$ (the odd GST bit lines not extending to cross the heater mask) and coupled between voltage control word line 942 and even bit lines BL$_2$ and BL$_4$ (see FIG. 4, illustrating the cross-section at the sidewall of the heater mask 1212 in the voltage control region in the word line direction).

In a similar fashion, a voltage control element for odd bit lines is obtained by extending the GST bit line mask 1214 further than for even bit lines, for example, on the opposite side of the array, so that it crosses an opposite region in the heater mask 1212. In another embodiment, the GST bit line mask 1214 is alternatively interrupted for odd and even bit lines within the array region, so that at the interruption no PCM cell is formed and the corresponding work line acts as a voltage control word lines for the complementary bit lines (even and odd, respectively).

As shown in FIG. 14, the top and bottom ends of he closed polygonal bit line mask 1214 have been cut away, as indicated at A in FIG. 14 (the lower ends are not shown in FIG. 14). This removes what otherwise would have been a second voltage control device 1260, shown in FIG. 13, without making any changes in the array. Moreover, each of the loops shown in FIG. 13 include a reverse offset B which extends from right to left and basically pushes the bit line 1214 from its wider spacing, in connection with the voltage control elements, to a narrower spacing in connection with the array. More particularly, the bit line BL0 does not shift at all, the bit line BL1 shifts a small amount, the bit line BL2 shifts a greater amount, and the bit line BL3 shifts the most. Then the pattern repeats.

Specifically, in one embodiment, BL1 shifts 1F, BL2 shifts 2F and BL3 shifts 3F, respectively. The result is that over the row clamp, the bit line BL2 falls exactly on the next bit line column, on the previous bit line BL3, and, thus, over the adjacent bipolar emitter. Therefore, the voltage control element for BL0 and BL2 is set.

Instead, what happens at BL1 and BL3 is not important because they will be cut on the upper row clamp region with a cut mask, as indicated at A in FIG. 14. They will be set on the edge of the array instead of BL0 and BL2. By offsetting the rows progressively from BL1 to BL4, the alignment required between the cut mask and the structures being cut is considerably relaxed. One bit line has the spacing of S. Thus, spacers can simply be used with a dimension in the word line direction of F on each side to create a 3F mask.

As a result of pitch doubling, the address lines between lines BL have a sublithographic pitch, i.e. a pitch is smaller than what is possible using lithography or less than about 1000 Angstroms.

While in FIG. 1 voltage control word lines for even and odd bit lines are at opposite sides of the PCM array 210, they may be located on the same side. In one embodiment, more than a single voltage controlling element is coupled to each bit line so that a better current draining and correspondingly a better and more uniform bit line voltage control is obtained. Correspondingly, multiple voltage control word lines are present, for example, two word lines, one on one side and the other on the opposite side of the PCM array 210 are present both for odd and even bit lines.

One or more voltage control word lines may also be present within a PCM array. When the voltage controlling elements include a PCM cell, an otherwise normal (i.e. for data storage) word line is coupled only with even or only with odd bit lines by interrupting the GST bit line mask 1214.

In one embodiment, the voltage controlling elements 260 are decoded independently from each other and only voltage controlling elements coupled to bit lines adjacent to addressed bit line are activated during a program pulse.

In all cases, the voltage control word lines are not selected during a read operation, so that the voltage controlling elements do not interfere with the outcome of the memory access in the PCM array 210.

Figure 15:
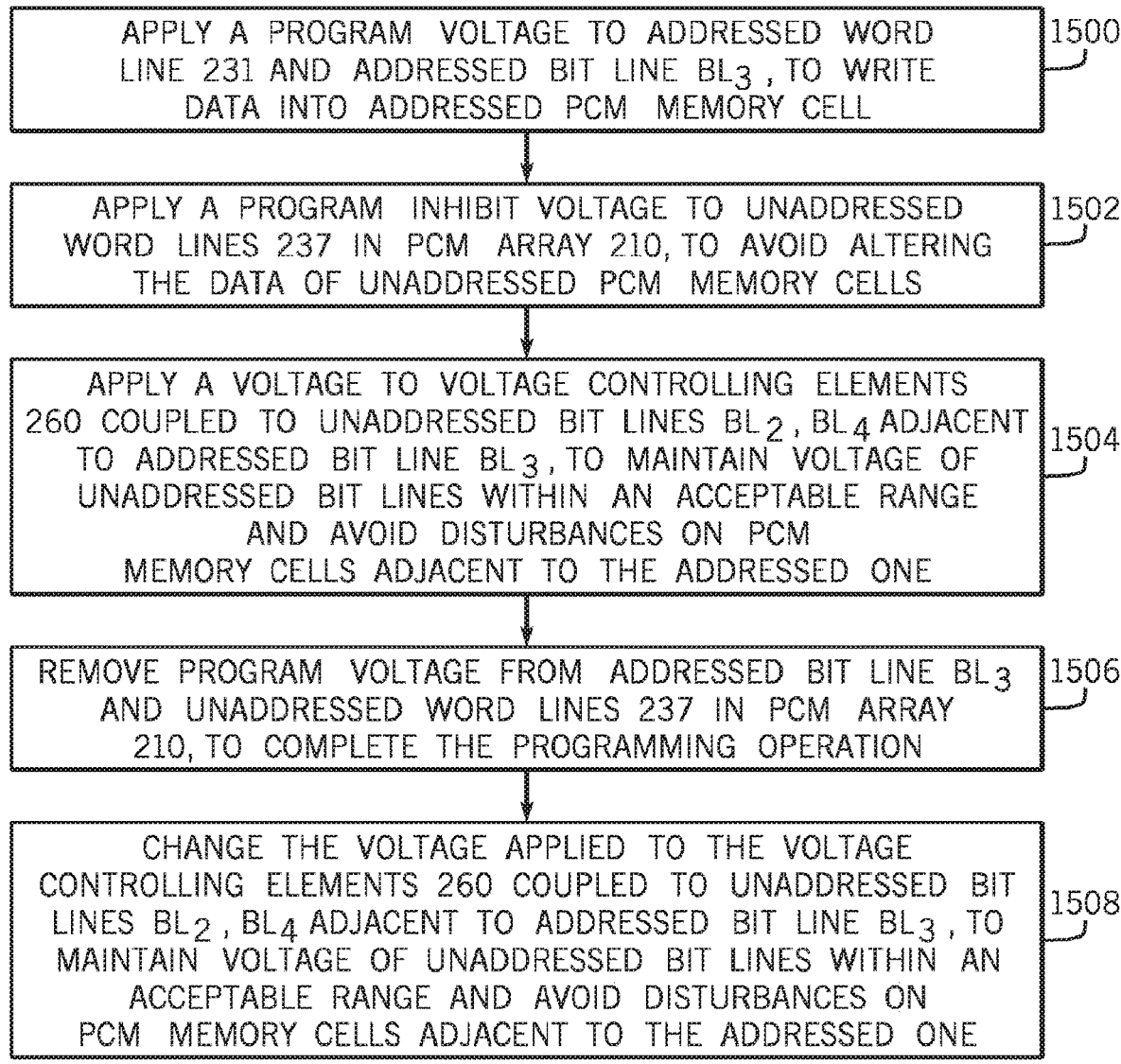
FIG. 15 illustrates an embodiment of a programming method.

FIG. 15 illustrates a block diagram of a method to program data into the PCM memory featuring voltage controlling elements 260 described above.

The data is stored at least into an addressed memory cell identified by an address; the addressed memory cell is coupled to an addressed word line and to an addressed bit line, for example, with respect to FIG. 1, the addressed memory cell may be the cell at the crossing of addressed word line 231 and addressed bit line $BL_3$. A word line programming voltage pulse (block 1500) is applied to the addressed word line and a bit line programming voltage pulse is applied to the addressed bit line (if multiple memory cells are addressed, corresponding bit lines are selected for simultaneous programming). For example, the programming voltages may be in the range 0 to 0.5V, i.e. 0.2V, on word line 231 and about 3 to 6V, i.e. 4.5V on $BL_3$, respectively. In one embodiment, the bit line voltage is raised with a short pulse, i.e. about 25 ns.

A programming inhibition voltage, for example the bit line programming voltage, is applied (block 1502) to unaddressed word lines 237 in the PCM array 210, to avoid generating an electric field in excess of the threshold voltage of the phase change material and therefore to avoid altering the data stored in unaddressed memory PCM cells. In this example in mention, 4.5V are applied to unaddressed word lines 237.

Voltage controlling elements 260, coupled to unaddressed bit lines $BL_2$ and/or $BL_4$ adjacent to addressed bit line $BL_3$, are biased (block 1504) to a voltage suitable to maintain the voltage of unaddressed bit lines within an acceptable range of 0.5-2.0V, for example about 1.5V, such that the chalcogenic material is at no time exposed to an electric field higher than its threshold and/or no parasitic bipolar transistor is turned on, therefore avoiding or minimizing possible disturbances on PCM memory cells adjacent to the addressed one(s). Correspondingly, no or minimal electrical disturbance affects the memory cells, not even those on the addressed word line.

The programming voltage is removed (block 1506) from the addressed bit line $BL_3$ to complete the programming operation in a precisely controlled way. The speed of the ramp-down may depend on the data to be written into the addressed memory cells (fast ramp-down if the phase change material must be quenched to an amorphous phase and slow ramp-down if time must be allowed for the phase change material to crystallize; intermediate ramp-down in case a partial amorphization is required, i.e. for multilevel data storage). The program inhibition voltage is also removed from the unaddress word lines 237 in the PCM array 210.

To maintain the voltage of unaddressed bit lines $BL_2$ and $BL_4$, adjacent to addressed bit line $BL_3$, within an acceptable range during the ramp-down of the programming pulse (i.e. to contrast the effect of capacitive coupling), the voltage applied to the voltage controlling elements 260 coupled to unaddressed bit lines $BL_2$. $BL_4$ adjacent to addressed bit line $BL_3$ is changed (block 1508) to maintain voltage of unaddressed bit lines within an acceptable range and avoid disturbances on PCM memory cells adjacent to the addressed one.

The exact sequence of the steps described above may be modified without departing from the scope of the invention and only some of the steps need to be implemented, for example in one embodiment no voltage controlling operation is actuated during program pulse ramp-down.

In the foregoing specification, the invention has been described with reference to specific exemplary embodiments thereof. It will, however, be evident that various modifications and changes may be made thereto without departing from the broader spirit and scope of the invention as set forth in the appended claims. For example, the PCM array may include MOS selection transistor rather than BJT selection transistors and/or the structure of the elementary PCM cell may be different from the one described and the manufacturing process varied accordingly. The specification and drawings are, accordingly, to be regarded in an illustrative, rather than a restrictive, sense.

What is claimed is:
1. A method comprising:
forming a first line of voltage control elements, said first line of voltage control elements extending in a first direction;
forming a second line of phase change memory cells in said first direction;
forming a plurality of strips extending in a second direction perpendicular to said first direction having a first pitch;
forming conductive sidewall spacers on said plurality of strips; and
removing said plurality of strips to leave said sidewall spacers having a second pitch that is twice the first pitch; and
forming address lines using said sidewall spacers in the second direction.

2. The method of claim 1 wherein said address lines include bit lines.

3. The method of claim 1 including forming a respective offset in the first direction along a length of said address lines.

4. The method of claim 3 including forming said plurality of strips in a closed polygonal shape.

5. The method of claim 4 including cutting ends from said closed polygonal shape to form two address lines of the address lines from each of said closed polygonal shapes.

6. The method of claim 5 including forming said two address lines by cutting the ends from said closed polygonal shape including one address line of said two address lines that extends to one end of an array of phase change memory cells and the other address line of said two address lines extends to an opposite end of said array.

7. The method of claim 6 including .forming offsets in said pitch-doubled address lines in said second direction at different points along adjacent ones of said pitch-doubled address lines.

8. The method of claim 7 including forming said offsets of progressively longer lengths in said second direction.

9. A method comprising:
forming a first line of voltage control elements, said first line extending in a first direction;
forming a second line of phase change memory cells in said first direction;
forming a first conductive line coupling a first voltage control element of said first line of voltage control elements to a first phase change memory cell of said second line of phase change memory cells, the first conductive line having a first portion and a second portion, the first portion of the first conductive line being offset from the second portion of the first conductive line in the first direction by a first distance, wherein the second portion of the first conductive line runs parallel with the first portion of the first conductive line and in a second direction that is perpendicular to the first direction, wherein the first conductive line has a same first total width along both the first and second portions, wherein the same first total width is measured in the first direction, wherein the first conductive line has a first offset portion that extends in the first direction between the first portion and the second portion and having a first total length in the first direction equal to the first distance to connect the first portion of the second conductive line to the second portion of the second conductive line, wherein the first offset portion has a second total width measured in the second direction that is equal to the first total width; and
forming a second conductive line having a first portion and a second portion, the first portion of the second conductive line being offset from the second portion of the second conductive line in the first direction by a second distance, wherein the second distance is half as long as the first distance, wherein the second conductive line has the same first total width along both the first and second portions, wherein the second conductive line has a second offset portion that extends in the first direction between the first portion of the second conductive line to the second portion of the second conductive line and having a second total length equal to the second distance to connect the first portion of the second conductive line to the second portion of the second conductive line, wherein the second offset portion has the second total width measured in the second direction that is equal to the first total width.

10. The method of claim 9, wherein the first portion of the first conductive line is parallel to the second portion of the first conductive line.

11. The method of claim 9, wherein the first conductive line is adjacent to the second conductive line.

12. The method of claim 11, wherein the first portion of the first conductive line is offset from the first portion of the second conductive line by a third distance and the second portion of the first conductive line is offset from the second portion of the second conductive line by a fourth distance.

13. The method of claim 9, wherein the second conductive line is coupled to a second phase change memory cell of said second line of phase change memory cells and terminates between the first line of voltage control elements and the second line of phase change memory cells.

14. A method comprising:
forming a plurality of voltage control elements in a first tine oriented in a first direction;
forming a plurality of memory cells in a second line oriented in the first direction;
forming a plurality of straight bitlines extending in a second direction perpendicular to the first direction between the first line of the plurality of voltage control elements and the second line of the plurality of memory cells, a straight bitline of the plurality of straight bitlines coupling a respective first voltage control element of the plurality of voltage control elements to a respective memory cell of the plurality of memory cells; and
forming a plurality of offset bitlines extending in the second direction, an offset bitline of the plurality of offset bitlines coupling a respective second voltage control element of the plurality of voltage control elements to respective second memory cell of the plurality of memory cells and having a. first portion and a second portion, wherein the first portion is offset from the second portion in the first direction by a first distance, wherein the second portion runs parallel with the first portion and in the second direction that is perpendicular to the first direction, wherein the offset bitline of the plurality of offset bitlines has a same first total width along both the first and second portions, wherein the same first total width is measured in the first direction, the offset bitline of the plurality of offset bitlines has an offset portion that extends in the first direction between the first portion and the second portion and having a first total length in the first direction equal to the first distance to connect the first portion to the second portion, wherein the offset portion has a second total width measured in the second direction that is equal to the first total width.

15. The method of claim 14, wherein the plurality of straight bitlines are separated by an offset bitline of the plurality of offset bitlines.

16. The method of claim 15, further comprising:
forming a second plurality of offset bitlines, extending in the second direction, an offset bitline of the second plurality of offset bitlines having a first portion and a second portion, wherein the first portion is offset from the second portion in the first direction by a second distance.

17. The method of claim 16, further comprising:
forming a third plurality of offset bitlines extending in the second direction, an offset bitline of the third plurality of offset bitlines having a first portion and a second portion, wherein the first portion is offset from the second portion in the first direction by a third distance.

18. The method of claim 17 wherein a straight bitline of the plurality of straight bitlines is separated from an offset bitline of the plurality of offset bitlines by an offset bitline of at least one of the second plurality of offset bitlines or an offset bitline of the third plurality of offset bitlines.

19. The method of claim 18, Wherein an offset bitline of the second plurality of offset bitlines and an offset bitline of third plurality of offset bitlines terminates between the first line and the second line.

20. The method of claim 19, Wherein the third distance is greater than the first distance, and the first distance is greater than the second distance.

\* \* \* \* \*